(12) United States Patent
Park et al.

(10) Patent No.: US 8,377,206 B2
(45) Date of Patent: Feb. 19, 2013

(54) APPARATUS AND METHOD OF FORMING SEMICONDUCTOR DEVICES

(75) Inventors: Youngsoo Park, Hwaseong-si (KR); Jungil Ahn, Suwon-si (KR); Myeongjin Kim, Pyeongtaek-si (KR); Sangyeob Cha, Seoul (KR); WanGoo Hwang, Yongin-si (KR); Youngsam An, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 699 days.

(21) Appl. No.: 12/545,983

(22) Filed: Aug. 24, 2009

(65) Prior Publication Data
US 2010/0064970 A1 Mar. 18, 2010

(30) Foreign Application Priority Data
Sep. 16, 2008 (KR) .................. 10-2008-0090756

(51) Int. Cl.
*C23C 16/00* (2006.01)

(52) U.S. Cl. .......................... 118/715; 118/728; 118/729
(58) Field of Classification Search .................. None
See application file for complete search history.

(56) References Cited

FOREIGN PATENT DOCUMENTS

| JP | 06-275533 | 9/1994 |
|---|---|---|
| KR | 1999-34610 | 8/1999 |
| KR | 2006-26355 | 3/2006 |

*Primary Examiner* — Robert Xu
(74) *Attorney, Agent, or Firm* — Stanzione & Kim, LLP

(57) ABSTRACT

An apparatus to form semiconductor devices includes an inner tube and an outer tube disposed to surround the inner tube. A plate is disposed at first open end of the inner tube to reduce variation between pressures at a first portion and a second portion inside the inner tube. The sum of areas of through-holes disposed on the plate is 10 to 60 percent of the entire area of the plate. The through-holes may include a first through-hole that is disposed at a central portion of the plate, and second through-holes disposed at an edge portion of the plate. The second through-holes are annularly arranged to surround the first through-hole.

5 Claims, 12 Drawing Sheets

FIG. 4A
FIG. 4B
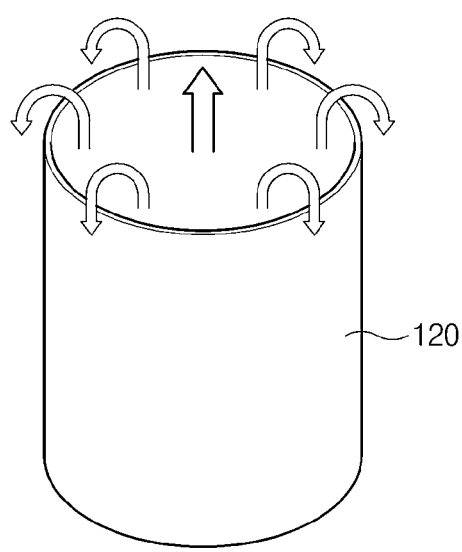
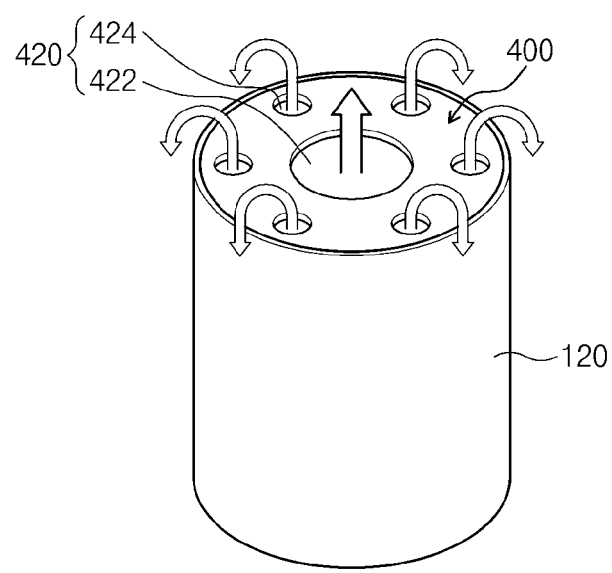

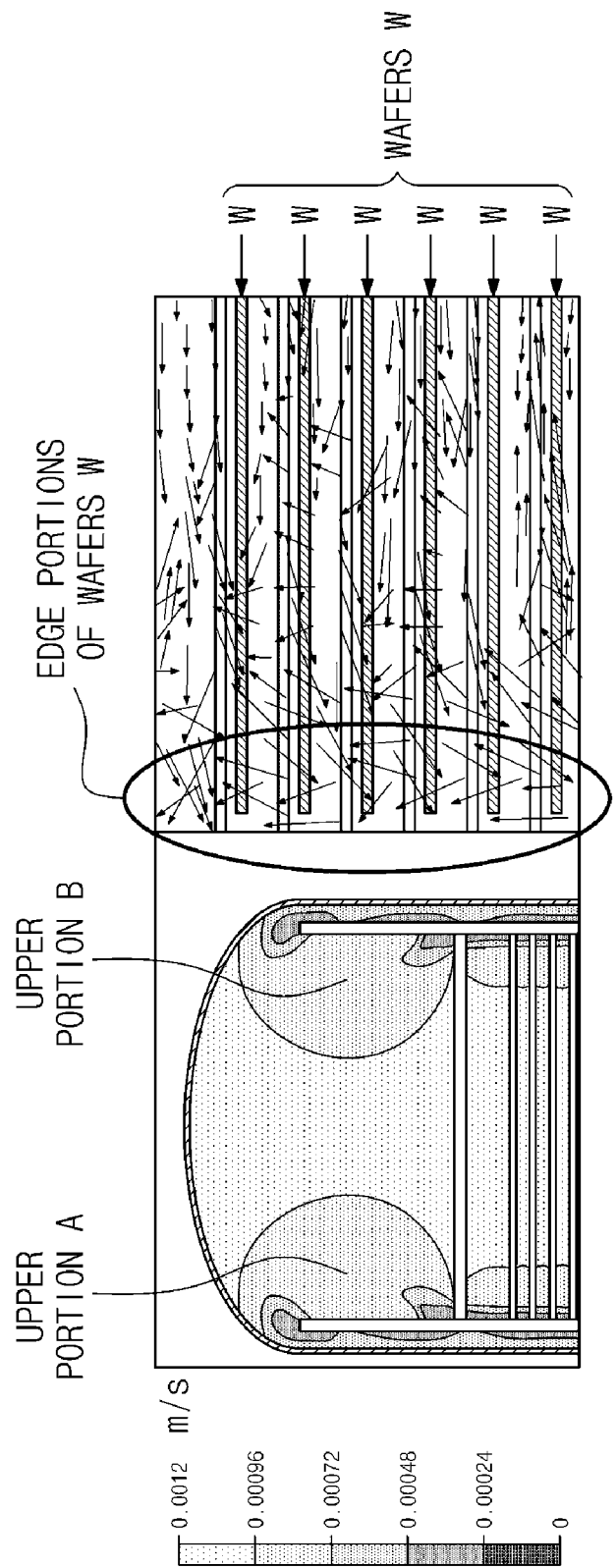

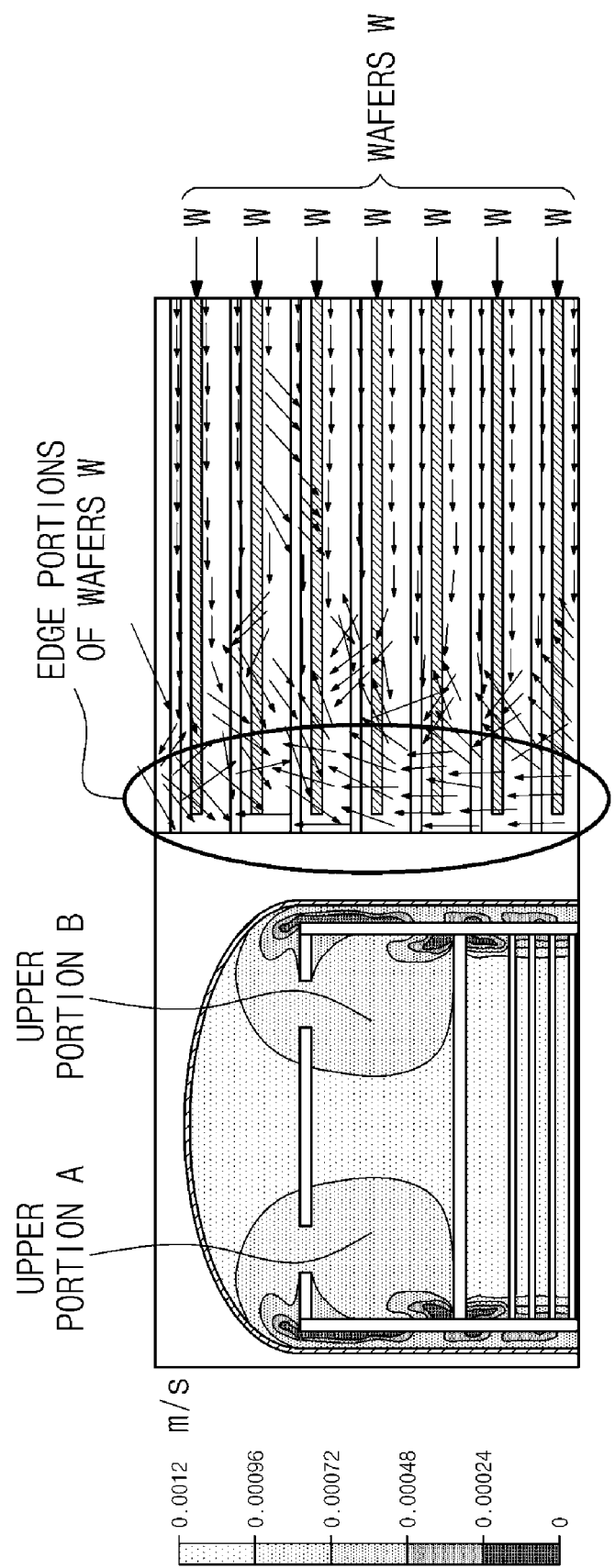

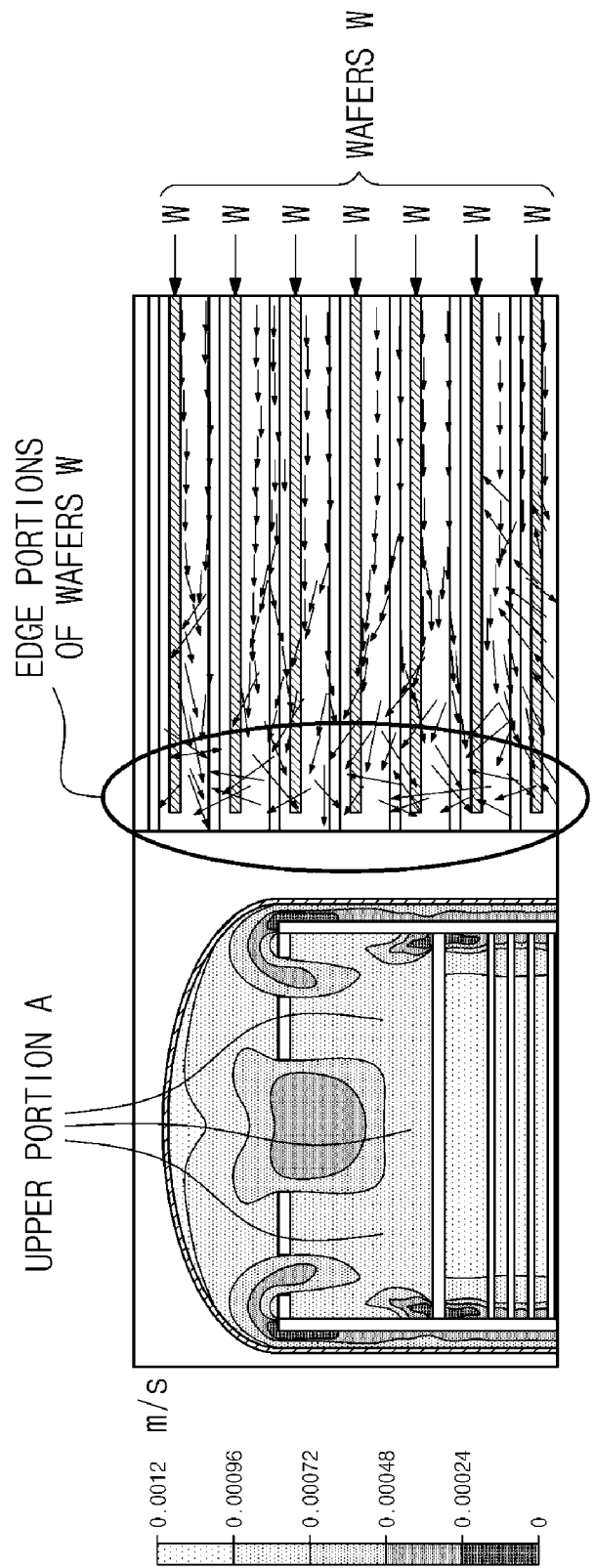

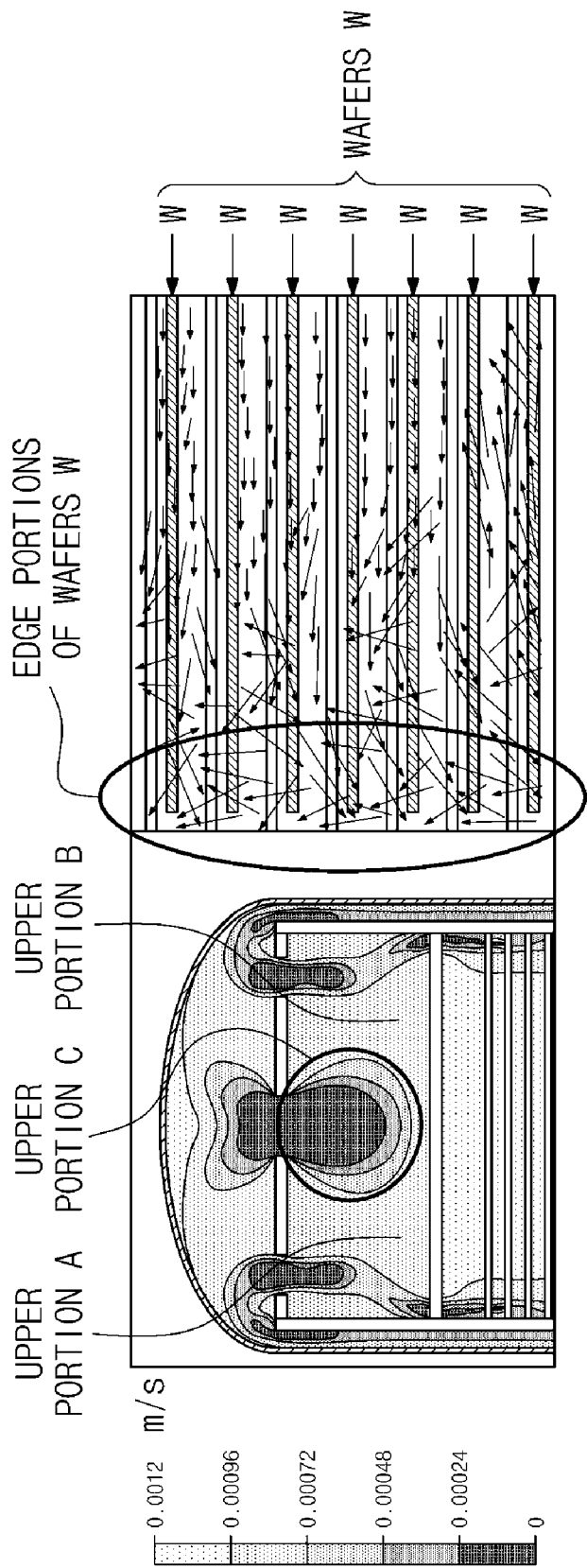

APPARATUS AND METHOD OF FORMING SEMICONDUCTOR DEVICES

CROSS-REFERENCE TO RELATED APPLICATIONS

This U.S. non-provisional patent application claims priority under 35 U.S.C §119 to Korean Patent Application No. 10-2008-0090756, filed on Sep. 16, 2008, the entirety of which is herein incorporated by reference.

BACKGROUND

1. Field of the Invention

The present general inventive concept relates to apparatuses and methods of forming semiconductor devices. More specifically, the present general inventive concept is directed to apparatuses and methods of performing a treating process such as diffusion or deposition for a plurality of wafers arranged vertically.

2. Description of the Related Art

A treating apparatus is used to perform a thermal diffusion process or a deposition process for forming semiconductor devices. In recent years, a vertical apparatus for forming semiconductor devices has been used to simultaneously perform the thermal diffusion process or the deposition process on a plurality of wafers.

A conventional vertical apparatus for forming semiconductor devices is provided to simultaneously treat 50 to 100 wafers stacked inside a chamber. However, when the vertical apparatus is used, deposition rate of wafers disposed at an upper portion inside a chamber is much lower than that of wafers disposed at a central or lower portion inside the chamber. In a single wafer disposed at the upper portion inside the chamber, deposition rate at an edge portion is much lower than that at a central portion.

SUMMARY

The present general inventive concept minimizes pressure gradients in a chamber such that gas to form at least a portion of a semiconductor may be uniformly supplied to the surfaces of wafers stacked in the chamber.

The present general inventive concept provides an apparatus to form semiconductor devices. The apparatus may include an inner tube, an outer tube disposed to surround the inner tube, a gas supply member to supply gas such that the gas flows from a first portion to a second portion of the inner tube, a gas exhaust member to exhaust the gas flowing in a first direction along a space between the inner tube and the outer tube, and a plate with at least one through-hole to allow the gas to flow therethrough, the plate disposed at a first open end of the inner tube. A sum of areas of the through-holes of the plate is 10 to 60 percent of the entire area of the plate. In exemplary embodiments, the sum of the areas of the through-holes of the plate may by 20 to 40 percent of the entire area of the plate.

Additional features and utilities of the present general inventive concept will be set forth in part in the description which follows and, in part, will be obvious from the description, or may be learned by practice of the general inventive concept.

In exemplary embodiments, the at least one through-hole includes at least one first through-hole disposed at a central portion of the plate and at least two through-holes may be formed at an edge portion of the plate.

The present general inventive concept also provides a method of forming semiconductor devices. The method may include preparing an apparatus to form semiconductor devices, the apparatus including an inner tube and an outer tube surrounding a side face and a first end of the inner tube, a plate having a plurality of through-holes disposed on the first end of the inner tube, where a sum of the areas of the through-holes is 10 to 60 percent of the entire area of the plate, positioning a plurality of wafers in the inner tube, and forming a thin film on a substrate of the wafer by supplying gas to flow in a second direction through a space between the inner tube and the outer tube after flowing in a first direction inside the inner tube. In exemplary embodiments, forming a thin film may include providing a plate at an upper portion inside the inner tube. The sum of areas of the through-holes may be 10 to 60 percent of the entire area of wafers to allow the gas to uniformly flow to an entire portion of the wafers and minimize pressure gradients in a plurality of regions inside the inner tube. In exemplary embodiments, the sum of areas of the through-holes of the plate may occupy 20 to 40 percent of the entire area of the plate.

Exemplary embodiments of the present general inventive concepts are also achieved by providing a method of forming semiconductor devices with an apparatus having an outer tube disposed to surround an inner tube, where a plate having a plurality of holes is disposed a first end of the inner tube, the method including stacking a plurality of wafers in the inner tube, supplying gas such that the gas flows from a first portion of the inner tube toward a second portion of the inner tube uniformly over the surfaces of the plurality of wafers and through the plurality of holes of the plate, and exhausting the gas flowing in a first direction along a space between the inner tube and the outer tube, where pressure gradients in a plurality of areas of the inner tube are minimized.

Exemplary embodiments of the present general inventive concepts are also achieved by providing an apparatus to form semiconductor devices, the apparatus including an inner tube having a first end and a second end, an outer tube disposed to surround the inner tube, a gas supply member to supply gas such that the gas uniformly flows over the surfaces of a plurality of wafers disposed in the inner tube, and a plate with at least one through-hole to allow the gas to flow therethrough, the plate disposed at the first end of the inner tube.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIGS. 4A and 4B are schematic diagrams illustrating the flows of gas exhausted from an inner tube when using an apparatus provided without the plate illustrated in FIG. 2 and an apparatus provided with the plate illustrated in FIG. 2, respectively;

FIGS. 6A through 9C comparatively illustrate the pressure of gas at an upper portion region inside an inner tube and the flow of gas between edge portions of wafers depending on whether a plate is provided and an open area of a through-hole formed at the plate.

DETAILED DESCRIPTION OF THE EMBODIMENTS

Figure 1:
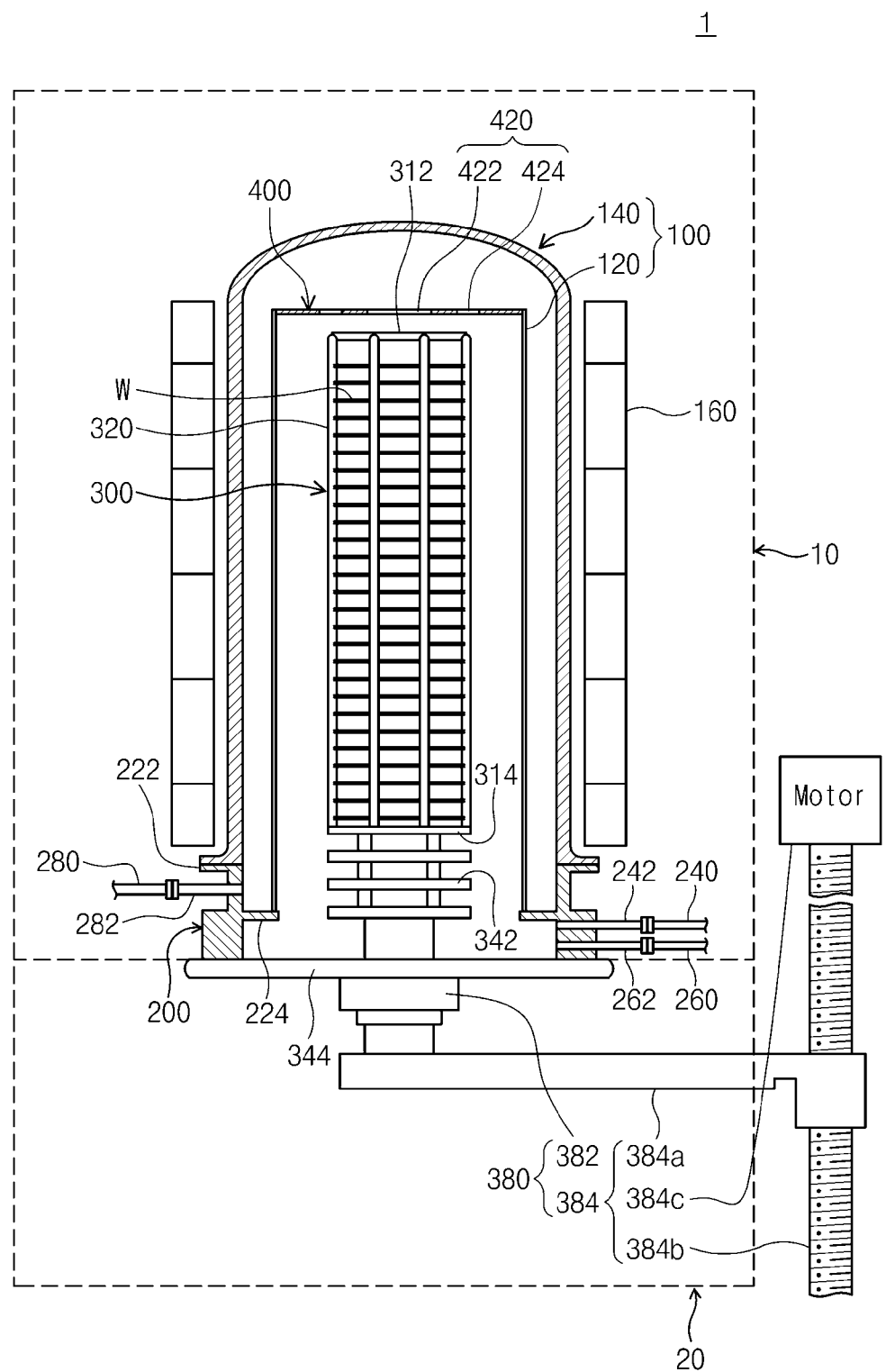
FIG. 1 is a vertical-sectional view illustrating a treating apparatus according to embodiments of the present general inventive concept.

The present general inventive concept will now be described more fully hereinafter with reference to the accompanying drawings, in which preferred embodiments of the present general inventive concept are illustrated. This present general inventive concept, however, may be embodied in many different forms and should not be construed as limited to the embodiments set forth herein. Rather, these embodiments are provided so that this disclosure will be thorough and complete, and will fully convey the scope of the present general inventive concept to those skilled in the art. In the drawings, the shapes of elements are exaggerated for clarity.

FIG. 1 illustrates an apparatus 1 to form semiconductor devices according to an embodiment of the present general inventive concept. The apparatus 1 includes a process room 10 and a standby room 20 which are vertically disposed. The standby room 20 is located below the process room 10. In the standby room 20, wafers W are either loaded into or unloaded from a boat 300. In the process room 10, a treating process such as diffusion deposition is performed on the wafers W.

A chamber 100 is provided inside the process room 10 to define a space where a process is performed to form a thin film on a wafer W. The chamber 100 includes an inner tube 120 and an outer tube 140, where each tube may be made of quartz or any other suitable material. The inner tube 120 is supplied with a cylindrical shape and a top and bottom thereof are open. The outer tube 140 has a top portion with a dome-shape and a side portion with a cylindrical shape. A bottom of the side portion of the outer tube 140 is open. The outer tube 140 surrounds the inner tube 120 and is installed to be spaced apart therefrom.

A heater 160 is disposed outside the outer tube 140 to at least partially surround the outer tube 140. The heater 160 may maintain the inside of the chamber 100 at a process temperature.

The inner tube 120 and the outer tube 140 are supported by a flange 200. A through-hole is formed at the center of the flange 200. The chamber 100 communicates with the standby room 20 via the through-hole. The flange 200 has a cylindrical shape, where a top and bottom thereof are open. A diameter of the flange 200 is similar to that of the outer tube 140.

An outside base 222 and an inside base 224 are provided at the flange 200 to support the outer tube 140 and the inner tube 120, respectively. The outside base 222 has a ring shape that extends outwardly from an upper end of the flange 200. The inside base 224 has a ring shape that extends inwardly from an inside wall of the flange 200.

Ports 242 and 262 are provided at one side of the flange 200, and a port 282 is provided at the other side thereof. The port 242 is connected to a process gas supply member 240 supplying process gas into the chamber 100, and the port 262 is connected to a purge gas supply member 260 supplying purge gas into the chamber 100. The port 282 is connected to a gas exhaust member 280 to exhaust gas from inside the chamber 100 to an exterior area. Due to the gas exhaust member 280, the interior of the chamber 100 is maintained at a predetermined low pressure during a process and reactive byproducts produced inside chamber 100 are forcibly discharged to the exterior area.

The ports 242 and 262 respectively connected to the process gas supply member 240 and the purge gas supply member 260 are disposed at lower positions than the inside base 224, and the port 282 connected to the gas exhaust member 280 is disposed between the inside base 224 and the outside base 222. According to the above structure, process gas flows into the inner tube 120 to be deposited on wafers W loaded on the boat 300 while flowing in a down-to-up direction. After a process, gases remaining inside the chamber 100 are exhausted to the exterior through an exhaust pipe 280 while flowing along a space between the inner tube 120 and the outer tube 140 in an up-to-down direction.

Wafers W, which may be processed, are loaded on the boat 300. The boat 300 includes a top plate 312 placed horizontally and a bottom plate 314 disposed to face the top plate 312. A plurality of vertical supports 320 are installed between the top plate 312 and the bottom plate 314. Slots are formed at the respective vertical supports 320, and the edge of a wafer W is inserted into the slots. However, shapes and structures of the boat 300 may be different from the above. The number of slots formed at the respective vertical supports 320 is approximately 50 to 100. Heat sinks 342 are provided below the bottom plate 314. The heat sinks 342 are made of quartz and installed horizontally. The boat 300 is supported by a cap 344 that has a plate shape. When the boat 300 is inserted into the inner tube 120, it comes in contact with a bottom surface of the flange 200 to seal the interior of the chamber from the exterior. A driver unit 380 is installed at the cap 344. The driver unit 380 includes a motor 382 for rotating the cap 344 and a lift 384 for elevating the cap 344. The lift 384 includes a bracket 384a, a screw 384b inserted into the bracket 384a and coupled with the cap 344, and a motor 384c provided to rotate the screw 384b. The rotation of the screw 384b enables the bracket 384a to travel linearly. After wafers W are loaded on the boat 300 in the standby room 20, they enter or leave the inner tube 120 by movement of the lift 384.

In an exemplary embodiment of the present general inventive concept, the plate 400 is disposed over the inner tube 120 in a position opposite the though hole between the process room 10 and the standby room 20. The plate 400 has a circular shape and is disposed such that its outer circumference is in contact with the inner tube 120. A plurality of through-holes 420 are formed at the plate 400. Each of the through-holes 420 acts as a path along which gas flows to the outer tube 140 from the inner tube 120. The plate 400 is provided to enhance pressure uniformity of gas throughout a plurality of regions in inner tube 120 according to vertical direction inside the inner tube 120. Further, the plate 400 is provided to increase a pressure of gas at an upper portion inside the inner tube 120 and reduce variation between pressures at an upper portion and other portions inside the inner tube 120. As a result, the plate 400 serves to enhance vertical deposition uniformity between wafers W inside the inner tube 120.

Figure 3A:
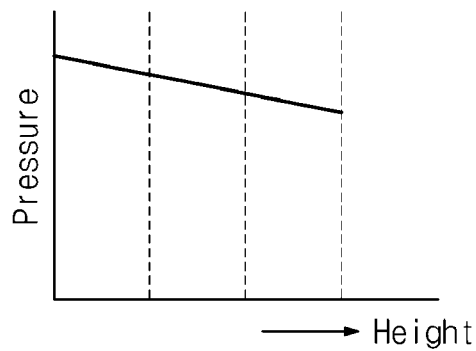
FIGS. 3A and 3B are graphs for comparatively illustrating pressure gradients in a plurality of regions according to vertical direction inside an inner tube when using an apparatus provided without the plate illustrated in FIG. 2 and an apparatus provided with the plate illustrated in FIG. 2, respectively.
Figure 3B:
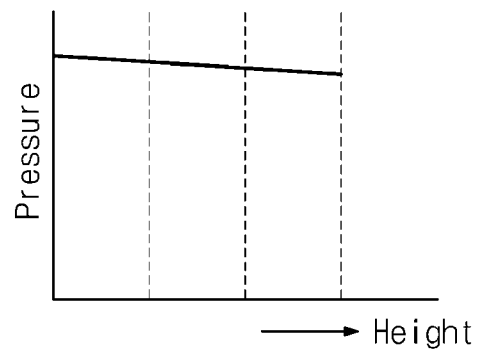

FIGS. 3A and 3B are graphs for comparatively illustrating pressure gradients at respective vertical portions inside an inner tube 120. When the plate 400 is not disposed on the inner tube 120 in apparatus 1, the pressure gradients in the plurality of regions in the inner tube 120 have increased variation. As illustrated in FIG. 3A, the pressure decreases when moving in a vertical direction from the lower regions of the inner tube 120 adjacent to cap 344 to the upper regions. However, when a plate 400 is disposed on the inner tube 120 in the apparatus 1, the pressure gradients between the lower and upper regions are considerably reduced, as illustrated in FIG. 3B. Therefore, it is possible to considerably increase deposition uniformity between wafers W throughout the plurality of regions inside the inner tube 120 by disposing a plate 400 having though-holes 420 on the inner tube 120.

An external exhaust pump (not illustrated) connected to a gas exhaust member 280 may minimize or prevent gas from flowing to a central portion of a wafer W at an upper portion inside the inner tube 120. Rather, the gas flows to the outside of the inner tube 120 after flowing over an edge portion of the wafer W. As a result, deposition uniformity of the central portion of the wafer is reduced at an upper portion inside the inner tube 120.

In a practical test where the plate 400 is not disposed on inner tube 120, an area inside the inner tube 120 may be equivalently divided into a lower area (25 wafers), an intermediate area (25 wafers), and an upper area (25 wafers) according to the number of wafers W. Deposition differences of respective portions of a wafer W disposed at the uppermost end of the respective areas were measured as follows: 25 angstroms, 70 angstroms, and 120 angstroms, respectively.

Figure 2:
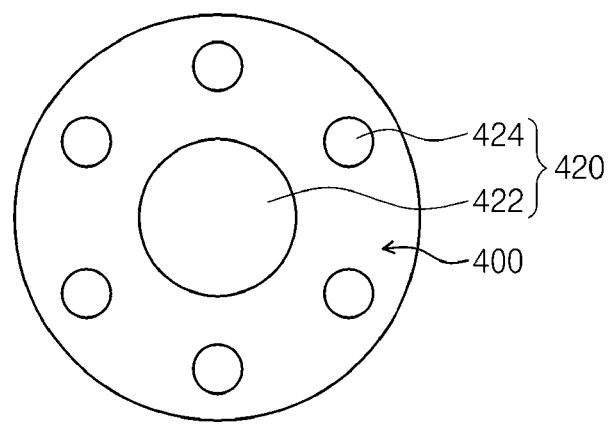
FIG. 2 is a top plan view of a plate illustrated in FIG. 1.

The through-holes 420 in plate 400 are formed to guide a large amount of gases to flow to the central portion of a wafer W. As illustrated in FIG. 2, a first through-hole 422 and a plurality of second through-holes 424 are formed at the plate 400. Specifically, the first through-hole 422 is formed at a central portion of the plate 400 and the second through-holes 424 are formed at the edge portion of the plate 400. The second through-holes 424 are formed to surround the first through-hole 422. The second through-holes 424 are disposed in a ring shape. Each of the first and second through-holes 422 and 424 has a circular shape. Each of the second through-holes 424 is provided to have a smaller diameter than the first through-hole 422. When viewed from above, the first through-hole 422 is formed to fully overlap a wafer W and the second through-hole 424 is formed to partially overlap the wafer W.

The first through-hole 422 guides process gas to flow to a central portion of a wafer W at an upper portion inside the inner tube 120. Each of the second through-hole 424 guides the process gas, which remains at the edge portion of the upper portion inside the inner tube 120, to be exhausted to the outer tube 140. I When the second through-hole 424 is not provided, a vortex may be generated at a contact area of the plate 400 and the inner tube 120. Due to long stay of the process gas at the contact area, the process gas is deposited at the sidewall upper end of the inner tube 120 and the edge of the plate 400 to act as a particle.

The diameter of the first through-hole 422 may be three times greater than that of the second through-hole 424. For example, if the diameter of a processing wafer W is 300 millimeters, the diameters of the first and second through-holes 422 and 424 may be 150 millimeters and 50 millimeters, respectively.

The size and disposition of the through-hole 420 formed at the plate 400 are not limited to the foregoing.

FIGS. 4A and 4B illustrate the flows of process gas in an apparatus provided without a plate 400 and an apparatus provided with the plate 400, respectively. As illustrated in FIG. 4A, where the plate 400 is not disposed on the inner tube 120, an increased amount of process gas is exhausted from the inner tube 120 through the edge of the inner tube 120 compared to the amount of process gas that is exhausted from the inner tube 120 through a central portion of the inner tube 120. Thus, deposition rate of a wafer W disposed at an upper portion inside the inner tube 120 is reduced at its central portion.

On the other hand, as illustrated in FIG. 4B, where the plate 400 is disposed at the upper end of the inner tube 120, the amount of process gas exhausted through a central portion of the inner tube 120 increases so as to increase the deposition rate at the central portion of the wafer W. That is, the deposition on the wafer W has increased uniformity between the edge and central portions of the wafer W.

Figure 5A:
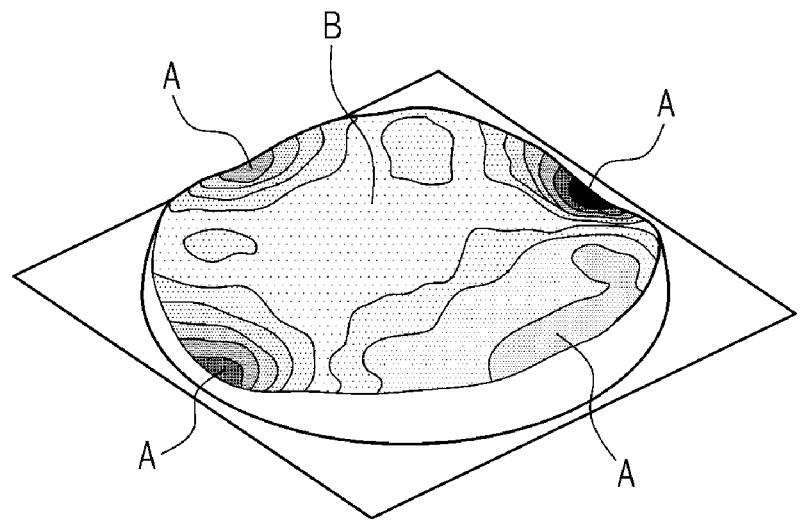
FIGS. 5A and 5B comparatively illustrate deposition rates at respective portions of a single wafer located at an upper portion of an inner tube when using an apparatus provided without the plate illustrated in FIG. 2 and an apparatus provided with the plate illustrated in FIG. 2, respectively.
Figure 5B:
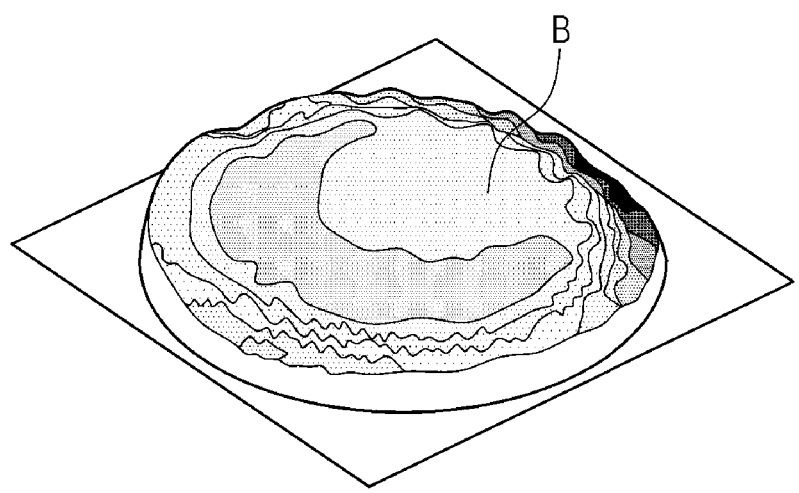

FIGS. 5A and 5B comparatively illustrate deposition states when a plate 400 is not disposed on the inner tube 120 to a bare wafer W where a pattern is not formed and when the plate 400 is provided thereto, respectively. The wafer W is a wafer disposed at an upper portion inside the inner tube 120. When a deposition process is performed on a bare wafer W, it is preferable that a central portion of the bare wafer W may be more protrusively exposed to the deposition process gasses than the edge portion of the bare wafer W to promote deposition uniformity in a single wafer W. This is because patterns are formed more densely at an edge portion of a wafer W than at an edge portion thereof, and larger amount of gas must be deposited to fill the interior of the wafer W.

Referring to FIG. 5A, when a deposition process was performed using apparatus 1 without the plate 400 disposed on the inner tube 120, a deposition rate at an edge portion (e.g., areas A of increased deposition) of a wafer W was much higher than that at a central portion (e.g., area B) of the wafer W. That is, FIG. 5A illustrates the non-uniformity of deposition, as areas A have increased deposition compared to other areas, such as central portion of area B. Referring to FIG. 5B, when a deposition process was performed using the apparatus 1 provided with the plate 400, a deposition rate at a central portion of a wafer W (e.g., area B) is increased. That is, when the apparatus 1 includes the plate 400, the deposition uniformity on wafer W increases.

Figure 6A:
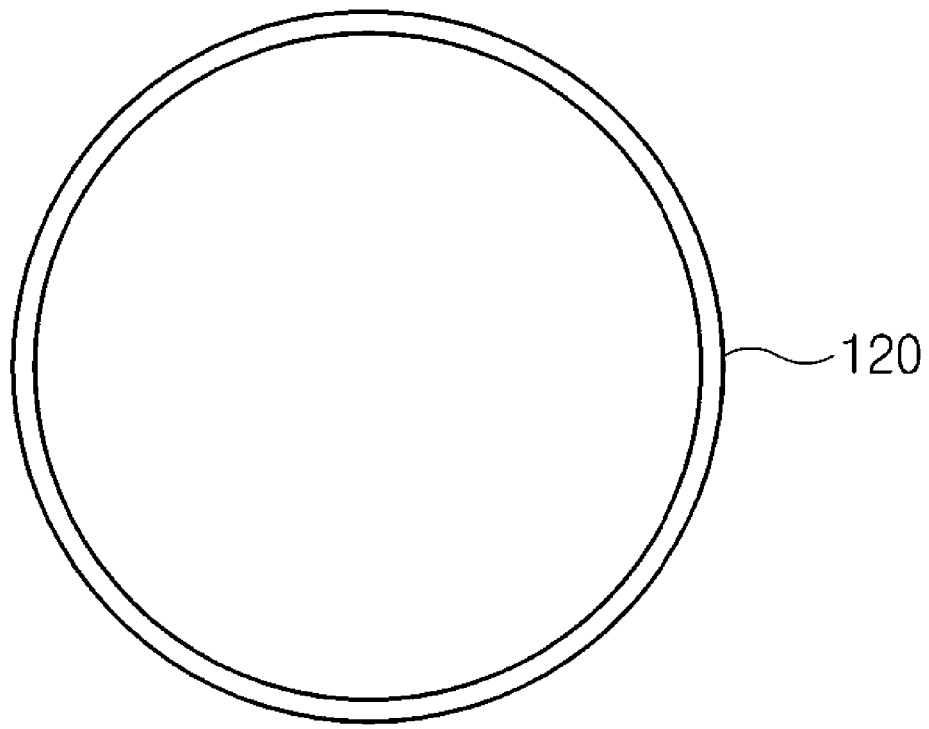
Figure 7A:
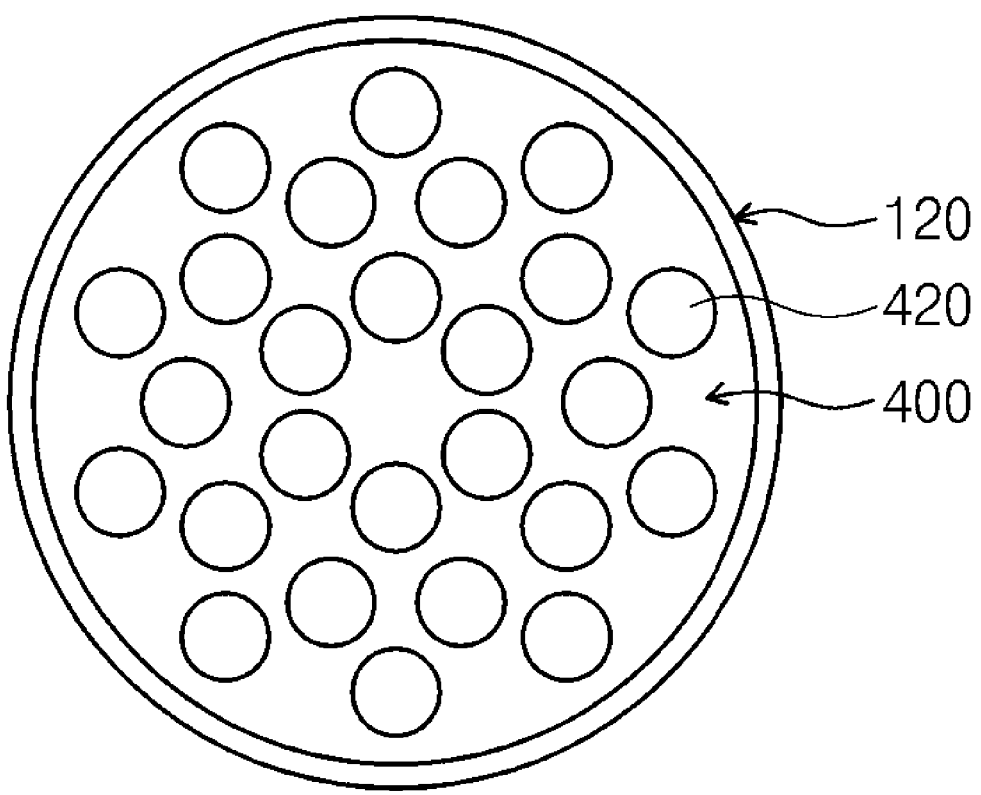
Figure 8A:
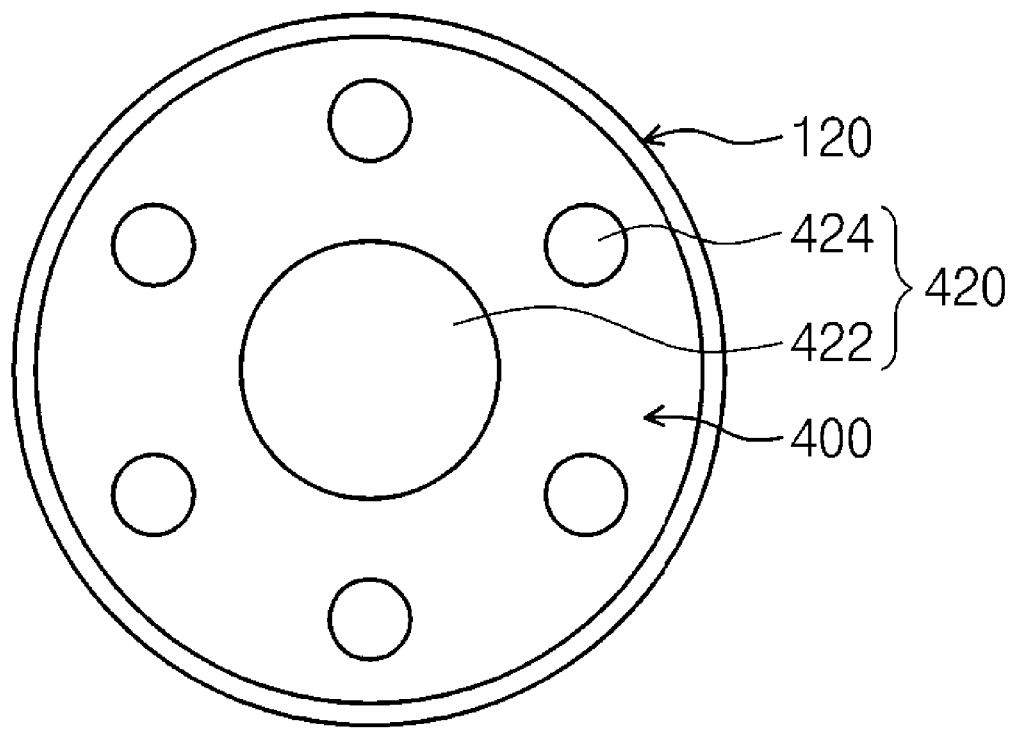
Figure 9A:
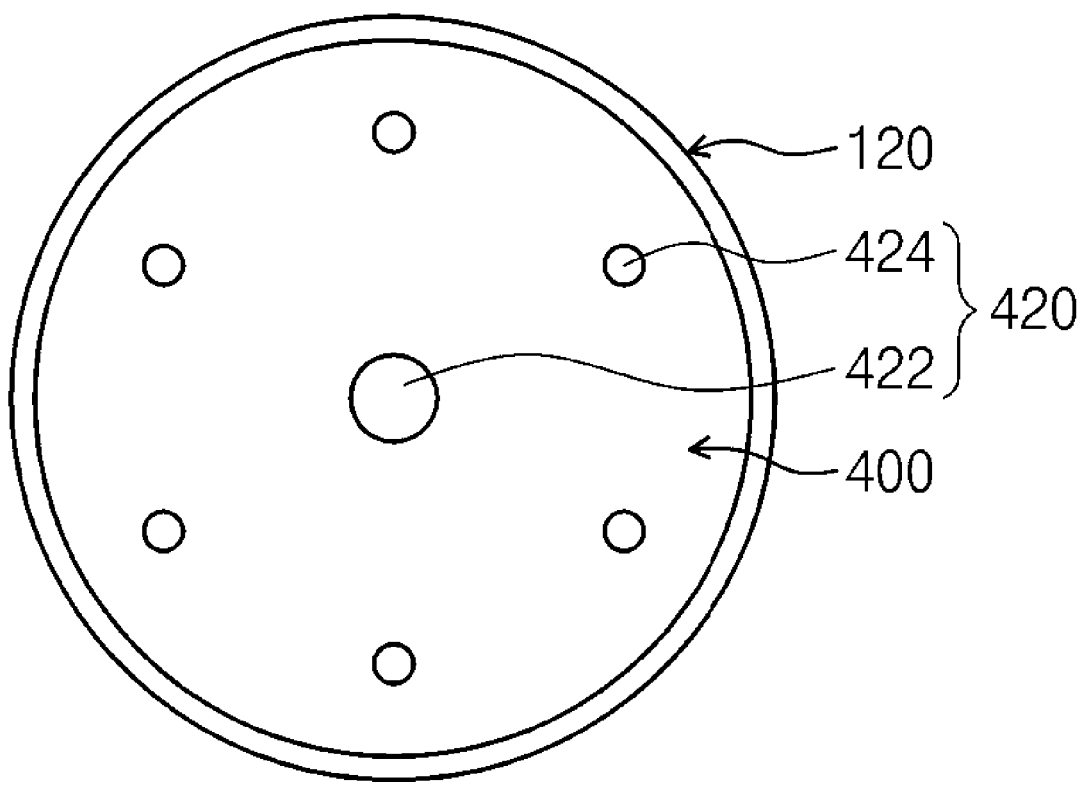

The value of the sum of open areas of through-holes 420 formed at the plate 400 may increase or decrease pressure and flow of process gas inside an inner tube 120. FIG. 6A through 9C illustrate a flow rate of process gas and flow of the gas between wafers W at an upper portion inside an inner tube 120 according to open areas of through-holes 420 formed at a plate 400. FIGS. 6A, 7A, 8A, and 9A are top plan views of the inner tube 120. In FIG. 6A, a plate 400 is not provided. In FIG. 7A, the sum of open areas of through-holes 420 occupies 50 percent of an area of the plate 400. In FIG. 8A, the sum of open areas of through-holes 420 occupies 25 percent of an area of the plate 400. In FIG. 9A, the sum of open areas of through-holes 420 occupies 5 percent of an area of the plate 400.

FIGS. 6B, 7B, 8B, and 9B are simulation diagrams of flow rates (distribution amount) of gas at an upper portion inside an inner tube 120 for FIGS. 6A, 7A, 8A, and 9A, respectively. FIGS. 6C, 7C, 8C, and 9C illustrate flows of gas between wafers W at the upper portion inside the inner tube 120 in cases of FIGS. 6A, 7A, 8A, and 9A, respectively. In the respective figures, a left portion is an edge portion of a wafer W.

As illustrated in FIG. 6B, where the plate 400 is not disposed on the inner tube 120, the amount of gas is not sufficient at an upper portion (e.g., upper portion A and upper portion B) inside an inner tube 120 because a flow rate of the gas is considerably low at the upper portion (e.g., upper portion A and upper portion B) inside the inner tube 120. As illustrated in FIG. 6C, there is no directionality of gases flowing between wafers W and flows of the gases are greatly unstable.

As illustrated in FIG. 7B, where the plate 400 disposed on the inner tube 120 has through-holes 420 that are formed to have an open area of 50 percent, the amount of gas at an upper portion (e.g. upper portion A and upper portion B) inside an inner tube 120 is larger than in FIG. 6B. As illustrated in FIG. 7C, flows of gases flowing between wafers W are improved in one direction except an edge portion of the wafer W.

As illustrated in FIG. 8B, where the plate 400 disposed on the inner tube 120 has through-holes 420 that are formed to have an open area of 25 percent, the amount of gas increases at the entire upper portion (e.g., upper portion A) inside the inner tube 120. That is, a large amount of gas is distributed corresponding to the entire portion of a wafer W disposed the upper portion (e.g., upper portion A) inside the inner tube 120. As illustrated in FIG. 8C, flows of gases flowing between wafers W are improved in one direction including the edge portion of the wafer W.

As illustrated in FIG. 9B, where the plate 400 disposed on the inner tube 120 has through-holes 420 that are formed to have an open area of 5 percent, a flow rate of gas at the upper portion (e.g., upper portion A and upper portion B) inside the inner tube 120 increases corresponding to the entire portion of a wafer W but a gas density is increased at the central portion (e.g., center portion C) of the wafer W. As illustrated in FIG. 9C, gases flowing between the wafers W lose their directionality and become unstable again at the end of the edge of the wafer W.

According to the test results in FIGS. 6A through 9C, where the plate 400 has the through-hole 420 is provided at the upper end of an inner tube 120, an increased amount of process gas is supplied to a wafer central portion (e.g. canter portion C) from an upper portion (e.g., upper portion A and upper portion B) of the inner tube 120 than when the plate 400 is not provided. Thus, a deposition rate and deposition uniformity are improved at a central portion of a wafer W disposed at the upper portion inside the inner tube 120. When the sum of open areas of through-holes 420 is above or below a predetermined threshold amounts, flows of gases are not stable at an edge portion of the wafer W. According to the test, where the sum of open areas of through-holes 420 occupies 10 to 60 percent of the overall area, deposition efficiency and uniformity are increased at the upper portion inside the inner tube 120. Where an area of the through-hole 420 occupies 20 to 40 percent of the overall area, the flow of gas is stable at the edge portion of the wafer W.

Accordingly, the sum of open areas of the through-holes 420 formed at the plate 400 may occupy between 10 to 60 percent of the entire plate 400. Preferably, the sum of open areas of the through-holes 420 formed at the plate 400 may occupy 20 to 40 percent of the entire plate 400.

Although the present general inventive concept has been described in connection with exemplary embodiments of the present general inventive concept illustrated in the accompanying drawings, it is not limited thereto. It will be apparent to those skilled in the art that various substitutions, modifications and changes may be made without departing from the scope and spirit of the general inventive concept.

What is claimed is:

1. An apparatus to form semiconductor devices, comprising:
   an inner tube having an open first end and an open second end;
   a boat disposed inside the inner tube to support a plurality of wafers such that the plurality of wafers are vertically stacked;
   an outer tube disposed to surround the inner tube and having a closed first end and an open second end;
   a flange provided with a ring-shaped outside base with a first side of the outside base supporting a surface of the second end of the outer tube and a ring-shaped inside base of the flange supporting a surface of the second end of the inner tube;
   a gas supply member connected to the flange below the inside base to supply gas to the inner tube;
   a gas exhaust member connected to the flange between the inside base and the outside base to exhaust gas inside the outer tube; and
   a plate with at least one through-hole to allow the gas to flow therethrough, the plate being disposed at the open first end of the inner tube, and the at least one through-hole including a first through-hole disposed at a central portion of the plate and a plurality of second through-holes disposed at an edge portion of the plate and arranged to surround the first through-hole,
   wherein the sum of open areas of the through-holes of the plate is 10 to 60 percent of the entire area of the plate.

2. The apparatus of claim 1, wherein the sum of open areas of the through-holes of the plate is 20 to 40 percent of the entire area of the plate.

3. The apparatus of claim 1,
   wherein the first through-hole is disposed to fully overlap a wafer loaded on the boat; and
   wherein each of the second through-holes is disposed to partially overlap a wafer loaded on the boat.

4. The apparatus of claim 3, wherein each of the second through-holes has a smaller area than the first through-hole.

5. The apparatus of claim 3, wherein each of the second through-holes have the same diameter, and the first through-hole has about three times larger diameter than the diameter of the second through-holes.

* * * * *